United States Patent [19]
Klein et al.

[11] Patent Number: 5,444,579
[45] Date of Patent: Aug. 22, 1995

[54] PREAMPLIFIER OF A SIGNAL FROM A VARIABLE RESISTANCE SENSOR, AND A CURRENT SOURCE

[75] Inventors: Hans W. Klein; Moises E. Robinson, both of Pleasanton, Calif.

[73] Assignee: IMP, Inc., San Jose, Calif.

[21] Appl. No.: 168,435

[22] Filed: Dec. 17, 1993

[51] Int. Cl.$^6$ ............................................. G11B 5/02
[52] U.S. Cl. .................................... 360/67; 330/305
[58] Field of Search ............... 360/67, 46, 113, 68, 360/66; 330/305, 306

[56] References Cited
U.S. PATENT DOCUMENTS

| | | | |
|---|---|---|---|
| 4,577,160 | 3/1986 | Lettvin et al. | 360/67 X |
| 4,706,138 | 11/1987 | Jove et al. | 360/67 |
| 4,786,993 | 11/1988 | Jove et al. | 360/67 |
| 5,032,935 | 7/1991 | Jove et al. | 360/67 |
| 5,103,353 | 4/1992 | Jove et al. | 360/67 |
| 5,122,915 | 6/1992 | Klein et al. | 360/67 |
| 5,142,242 | 8/1992 | Schaffer | 330/253 |
| 5,204,789 | 4/1993 | Jove et al. | 360/67 |

*Primary Examiner*—Donald Hajec
*Assistant Examiner*—Thien Minh Le
*Attorney, Agent, or Firm*—Majestic, Parsons, Siebert & Hsue

[57] ABSTRACT

A preamplifier provides an output signal which follows a varying resistance of a sensor of a condition or parameter. An example sensor is a magneto-resistive head employed in computer mass storage systems to read magnetic signals recorded on a magnetic tape or disk. The preamplifier uses a current-mode amplifier to increase its bandwidth and reduce signal distortion. A current source, used with the preamplifier or some other circuit, includes a low pass filter to reduce the effects of various noise sources.

19 Claims, 3 Drawing Sheets

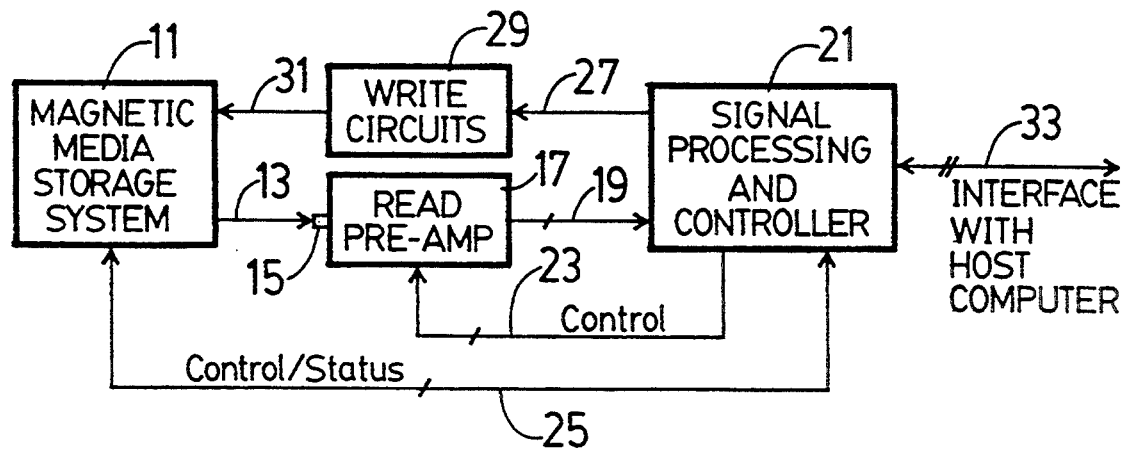
FIG._1.
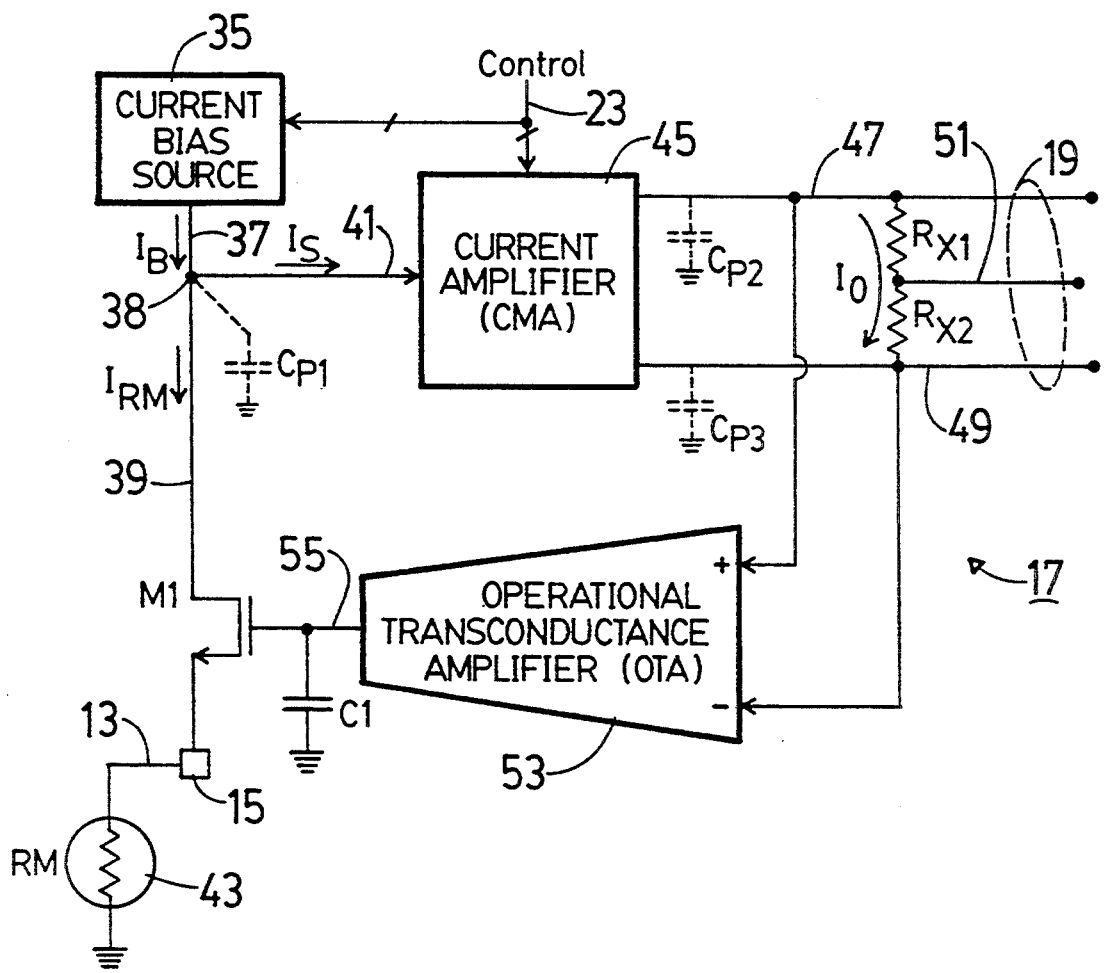
FIG._2.

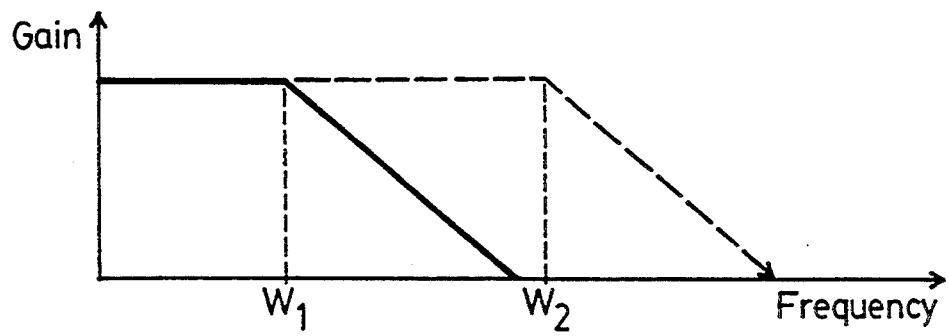
FIG._3.
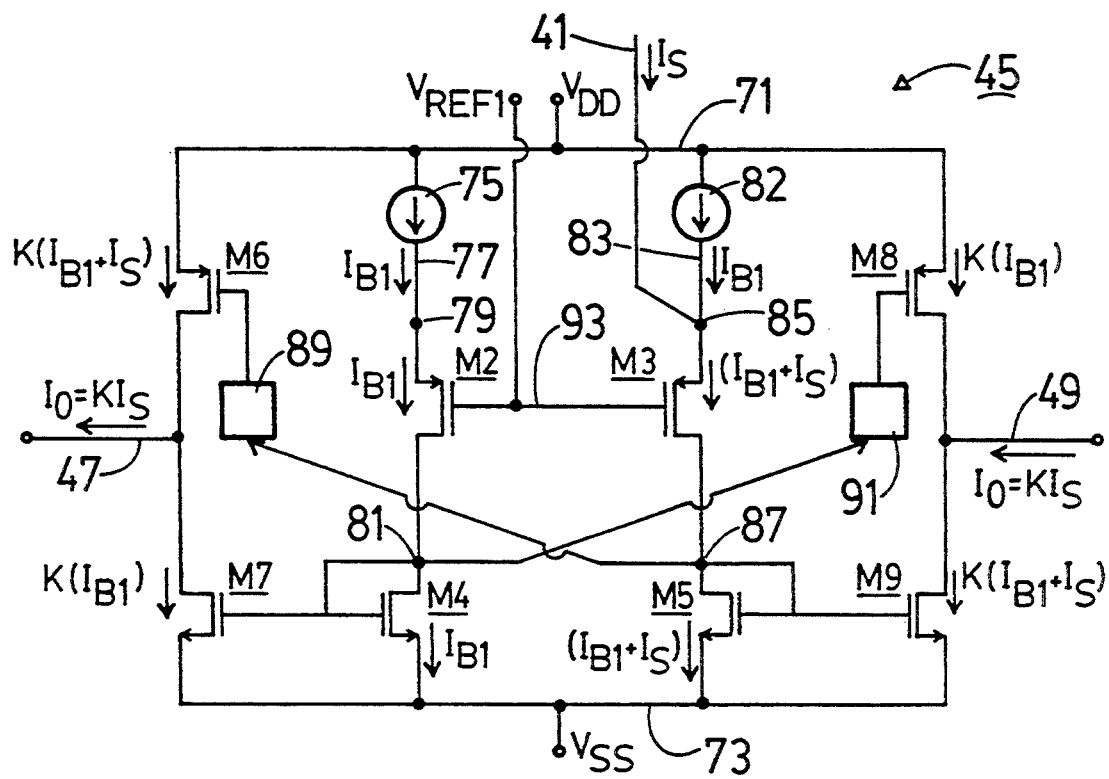
FIG._4.
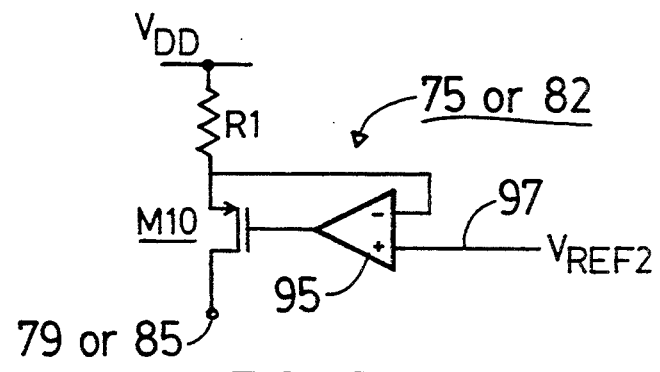
FIG._5.

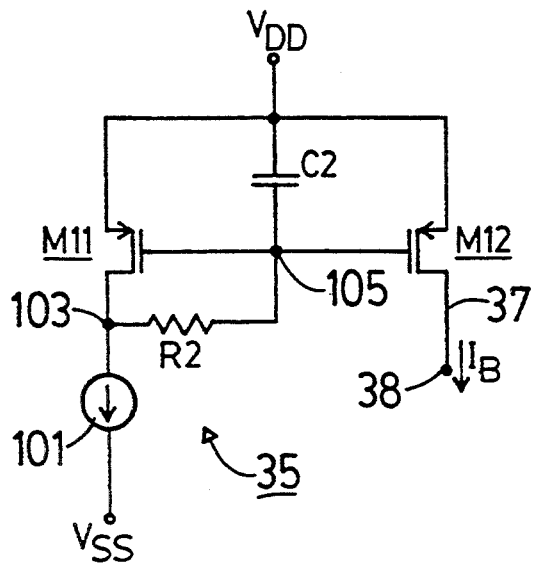
FIG._7.
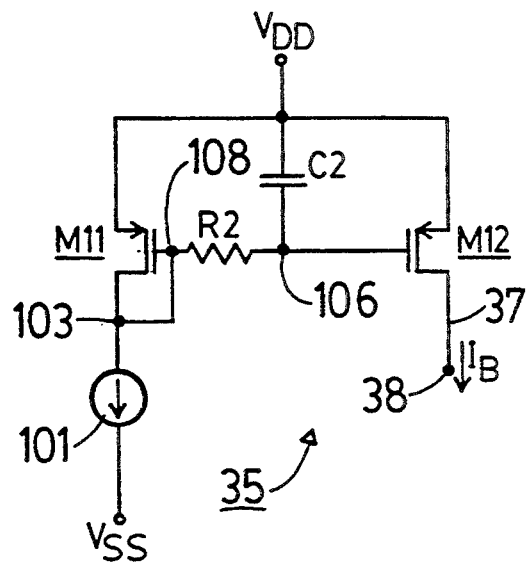
FIG._6.
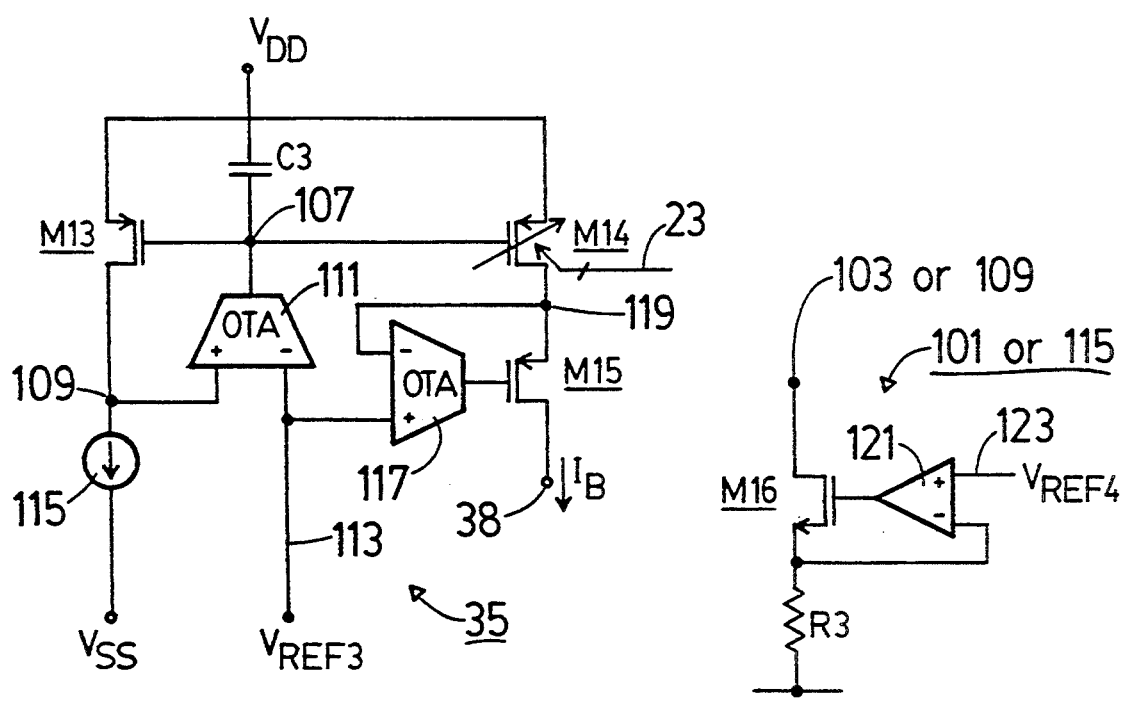
FIG._8.
FIG._9.

PREAMPLIFIER OF A SIGNAL FROM A VARIABLE RESISTANCE SENSOR, AND A CURRENT SOURCE

BACKGROUND OF THE INVENTION

This invention relates generally to preamplifiers of signals from sensors having a resistance that varies in a manner related to a condition or parameter being measured, and, separately, to bias current sources.

One such variable resistance sensor is a magneto-resistive element that is positioned as a read element in a read/write head of magnetic tape and magnetic disk mass storage systems. The small resistance of such an element varies a small percentage in response to variations in a magnetic field it is detecting. In order to obtain a signal output, such an element is biased with a constant current through it or voltage across it, and then variations in the other of the current or voltage are amplified. Since this signal variation is quite small, great care must be taken in its initial amplification in order to maintain a high signal-to-noise ratio.

One such preamplifier is disclosed in U.S. Pat. No. 5,122,915 of Klein et al. (1992), the disclosure which is incorporated herein by this reference. Briefly, that preamplifier maintains a constant voltage across the magneto-resistive head element. A varying current that follows the varying resistance of the sensing element is converted into a varying voltage signal output. This voltage signal output is larger than a voltage variation that would exist across the magneto-resistive head element with a constant biased current applied.

However, the gain-bandwidth product of preamplifiers following the design in U.S. Pat. No. 5,122,915 is somewhat limited, unless the overall gain is made less than desired or other sacrifices are made. This is believed due to the existence of parasitic capacitance in combination with an output resistor that converts the varying head current into a varying voltage output. This bandwidth limitation is of no concern in many applications but, for other applications, it is desired to remove such a limitation. Therefore, it is the primary object of the present invention to improve the preamplifier circuit described in U.S. Pat. No. 5,122,915, particularly to provide an increased gain-bandwidth product, and also to further decrease any distortion present in the output signal.

It is another object of the present invention to provide an improved current source, for use in such a preamplifier or in other more general applications, that exhibits a reduced level of noise.

SUMMARY OF THE INVENTION

The preamplifier of U.S. Pat. No. 5,122,915 is improved, according to one aspect of the present invention, by insertion of a current mode amplifier in the path of the varying current signal before it is passed through the output resistance that converts it into a voltage signal. Alternatively, the unconverted amplified current signal can be utilized directly by subsequent current mode circuits. The current mode amplifier has a much lower input impedance than the output resistor. It is this lower input impedance which now defines a limitation on the preamplifier bandwidth, in combination with the parasitic capacitance of the circuit. A much larger bandwidth results from this. The current mode amplifier further isolates the output resistance from participating with the parasitic capacitance at the input to limit the overall bandwidth, so that resistance can now be sized to obtain a higher preamplifier gain. Further, the overall gain of the circuit can be made adjustable by causing the gain of the current mode amplifier to be adjusted. Additionally, use of the current mode amplifier allows a fully differential voltage output to be generated from a single ended current input signal.

According to another aspect of the present invention, an improvements have been made in current sources. One improvement includes a low pass filter between the two transistors forming a current mirror of a typical current source. This low pass filter may be implemented by a number of specific types of circuits, including a resistance-capacitance filter or a transconductance amplifier and capacitor. Another improvement uses transconductance amplifiers to equalize the voltage of two nodes of the current mirror in order to optimize performance.

Additional objects, features and advantages of the various aspects of the present invention will become apparent from the following description of its preferred embodiments, which description should be taken in conjunction with the accompanying drawings.

BRIEF DESCRIPTION OF THE DRAWINGS

FIG. 1 generally illustrates a magnetic media mass storage system as a example of an application of the improvements of the present invention;

FIG. 2 is a schematic block diagram of the preamplifier of FIG. 1, which embodies the improvements of the present invention;

FIG. 3 includes curves that show the bandpass characteristic of the preamplifier of FIG. 2;

FIG. 4 is a schematic circuit diagram of a preferred current amplifier used in the preamplifier of FIG. 2;

FIG. 5 is an example circuit of the basic current source employed in the amplifier of FIG. 4;

FIG. 6 shows an improved current source that may be used in the preamplifier of FIG. 2 and other applications;

FIG. 7 shows a variation in the current source of FIG. 6;

FIG. 8 is another embodiment of the improved current source of the present invention; and FIG. 9 is an example circuit of the basic current sources used in the circuits of FIGS. 6–8.

DESCRIPTION OF THE PREFERRED EMBODIMENTS

Referring initially to FIG. 1, a computer data storage system is generally illustrated. A tape or disk drive 11 includes a magneto-resistive read head (not shown in FIG. 1 but is element 43 of FIG. 2) that is connected by a line 13 to a pin 15 of a preamplifier circuit 17. An output of the preamplifier in lines 19 is applied to a signal processing and controller circuit 21. The controller within the circuits 21 can set certain parameters in the preamplifier 17 by appropriate control signals in circuits 23. Similarly, circuits 25 carry appropriate control and status signals between the controller within the circuits 21 and the tape or disk drive 11.

The mass storage system of FIG. 1 also includes the ability to write data onto the tape or disk. Write signals are carried in a line 27 to appropriate write driving circuits 29 which are then applied through a line 31 to write head element that magnetizes the magnetic media in accordance with the signal applied in the line 31. The entire system of FIG. 1 is generally interfaced with a host computer over a bus 33.

A preferred implementation of the preamplifier 17 of the system of FIG. 1 is shown in FIG. 2. The preamplifier of FIG. 2 converts small resistance variations in the magneto-resistive read head element 43 into significant voltage variations in output lines 19. In the example of the mass storage system of FIG. 1, the element 43 changes its resistance in response to a varying magnetic field being read from a magnetic tape or disk that is moved passed the element 43. Although this is a significant application of the preamplifier of FIG. 2, it is not limited to such a use. The same principles can be applied to use the preamplifier for converting other magnetic signals detected by a magneto-resistive element into corresponding electrical signals. Audio tape is another such application. Further, the preamplifier FIG. 2 can serve the same purpose in measurements of other conditions or parameters by use of sensors whose resistance varies in a known manner with the condition or parameter being measured. Specific forms of such a sensors can be used to measure various chemical, thermal, physical and similar categories of conditions or of parameters.

The aspects of the preamplifier circuit of FIG. 2 that are also included in the circuit of aforementioned U.S. Pat. No. 5,122,915 will first be described. The prior preamplifier is best understood by separately considering its DC and AC operation. A source 35 of substantially constant current $I_B$ provides a DC bias current through a circuit including line 39, through the source and drain of a field effect transistor M1, and then through the magneto-resistive read head element 43 to a reference potential such as ground. A line 41 is connected in the prior circuit directly to an equivalent of series connected output resistors $R_{X1}$ and $R_{X2}$, since a current amplifier 45 shown in FIG. 2 is not present in the earlier circuit. An operational transconductance amplifier 53 has its differential inputs connected across this output resistance. A voltage output in a line 55 is proportional to any voltage drop across the output resistance, and is applied to a gate of the transistor M1. A feedback loop is thus created which tends to maintain the DC voltage at the pin 15 at a constant level. This also results in a signal current $I_S$ in the line 41 having no DC component. The bandwidth of the feedback loop is maintained very low by including a large capacitance C1 connected between the line 55 and a reference potential. The control loop operates only at DC and, for a magnetic tape drive embodiment, up to a frequency of less than about 10 kHz.

The signal band is much higher, being above 100 kHz., and even above 10 MHz., for tape drive applications. That is, the resistance of the head element 43 varies at the high signal frequency, thus causing its current $I_{RM}$ to similarly vary around the level of its DC bias current component $I_B$. The signal current $I_S$ similarly varies ($I_B = I_S + I_{RM}$) and, in the prior preamplifier without the current mode amplifier 45, passes directly through the output resistance in order to provide an output voltage signal. The control loop including the amplifier 53, as discussed above, is not given enough bandwidth to respond to the signal band, so a signal output appears across the output resistance.

In that prior design, which does not utilize the current amplifier 45, the bandwidth of the circuit is limited by parasitic capacitance $C_{P1}$ and the output resistance through which the output current $I_S$ flows directly. This parasitic capacitance is dominated by the capacitance of the drain of the transistor M1, the output of the current source 35 and the input to the amplifiers 53. The bandwidth of the circuit can be increased by minimizing the parasitic capacitance but this is difficult to do since the transistor M1 must be large in order to handle a large current $I_{RM}$ and to have reduced noise. A large transistor M1 results in a large parasitic capacitance. The bandwidth of the prior circuit can alternately be increased by reducing the value of the output resistance but then the gain of the circuit is decreased. The output resistance is intentionally made to be many times that of the magneto-resistive element 43 in order to provide some gain.

Therefore, the current amplifier 45 is added to the circuit of U.S. Pat. No. 5,122,915 in order to uncouple these related factors which must otherwise be traded off against one another. The current amplifier 45 isolates the node 38, where the undesired parasitic capacitance $C_{P1}$ is exhibited, from the output resistance, in this case a series combination of resistors $R_{X1}$ and $R_{X2}$. The output resistance is no longer coupled with the parasitic capacitance $C_{P1}$ to limit the overall signal bandwidth of the preamplifier. Instead, an input resistance of the current amplifier 45 is substituted. Since this input resistance is very low, a bandpass filter formed predominately by it and the parasitic capacitance $C_{P1}$ has a higher cutoff frequency. This is illustrated in FIG. 3 where the bandpass of the preamplifier circuit without the current amplifier 45 is shown in a solid line, and the improved circuit including the amplifier 45 is shown with a dashed line. The output resistance can then be made whatever value is desired for an appropriate gain or other considerations, without unduly limiting the bandwidth of the circuit.

Referring again to FIG. 2, a preferred current amplifier 45 provides an output current $I_O$ in lines 47 and 49 which, when driven through the resistors $R_{X1}$ and $R_{X2}$, provide a fully differential voltage output at those lines. Another filter is formed between this output resistance and parasitic capacitance $C_{P2}$ and $C_{P3}$ at the outputs of the current amplifier 45 but this is not so important because of the relatively low values of this parasitic capacitance.

Use of the current amplifier 45 is advantageous when having an amplification of one but preferably is made to have a gain that is programmable by signals in lines 23 to higher gain levels. A range of gain of from one to five is particularly convenient. When provided with the fully differential output, as shown, however, the amplifier effectively has a gain of 2 even though its internal gain is unity. Another advantage of including the current mode amplifier 45 is that a potential cause of distortion in the prior circuit without the amplifier 45 is avoided. That potential cause is the direct coupling, in the prior circuit, of the drain of the transistor M1 with the output resistor, thereby allowing the output signal to affect operation of M1. Use of the amplifier 45 eliminates that potential problem.

A preferred implementation of the current amplifier 45 is shown in FIG. 4. This circuit is connected at a line 71 by one power supply terminal $V_{DD}$, which is usually a positive voltage, and at a line 73 by another power terminal $V_{SS}$, which is preferably a negative voltage with an absolute magnitude equal to $V_{DD}$ in order to be able to easily provide a fully differential voltage output 19. Alternatively, in other specific circuits, $V_{SS}$ is held at ground potential. Two sources 75 and 82 of bias current $I_{B1}$ in respective lines 77 and 83 can be of any standard design, such as that illustrated in FIG. 5. Current is maintained constant through a resistance R1 by its voltage being compared by a differential amplifier 95 with a reference voltage applied to a line 97. The current sources 75 and 82 drive current through respective series connected transistors M4 and M5. The current through the transistor M4 is the bias current $I_{B1}$, while the current through the transistor M5 is a sum of that bias current plus the input current $I_S$ that is inserted through line 41 into node 85. The input current $I_S$ will generally include both positive (flowing in the direction shown) and negative (flowing in an opposite direction) components.

Each of the transistors M4 and M5 is a mirroring transistor. The current through the transistor M4 is mirrored to output transistors M7 and M8. Similarly, the current through the transistor M5 is mirrored to output transistors M6 and M9. The output transistors M6 and M7 are connected in series across the voltage supply lines 71 and 73, with the output line 47 connected between them. Similarly, the output transistors M8 and M9 are connected across the voltage supply lines 71 and 73 with the output signal line 49 connected between them. Because the output transistor M6 is necessarily of a different type (p- or n-type) than its mirroring transistor M5, an appropriate conversion is made by a circuit indicated as 89 which can include yet another multi-transistor current mirror circuit. A similar conversion is made at 91 for the output transistor M8.

The current amplifier 45 of FIG. 4 provides an output current $I_O$ that is equal to the input current $I_S$ multiplied by a gain factor k. If all of the transistors M4–M9 are of the same size, the amplification factor k is equal to 1. Looking at the current mirror of transistors M5 and M9, for example, will be seen that the current through the transistor M5 is mirrored into the output transistor M9. Those currents will be the same if the transistors M5 and M9 have the same size. However, if transistor M9 is made to be twice as large (that is, to have one half of the impedance), then the amplification factor k is equal to 2. In the circuit of FIG. 4, each of the output transistors M6–M9 needs to be of the same size as the other, relative to that of the transistors M4 and M5, which are made to be have the same size. This relative size of the current mirror output transistors can be made programmable by including several transistors selectably connectable in parallel. For example, the output transistor M9 can be replaced by two or more transistors with their sources and drains connected in parallel, each of the individual transistors being of the same size as the mirroring transistor M5. The gates of these several output transistors making up the transistor M9 are then connected to a switch so one, two, three, or however many individual transistors make up the output transistor M9 may be connected together to the gate of the mirroring transistor M5. Such programmability, if provided in a modified version of the circuit of FIG. 4, is controlled by signals in the lines 23.

The use of transistors M2 and M3, provided respectively in the current paths of sources 75 and 82, is optional. They are shown in FIG. 4 because their use has an advantage of allowing the size of the respectively connected mirroring transistors M4 and M5 to be reduced. This has a further effect that at least the corresponding output transistors M7 and M9 can also be significantly reduced in size. An advantage of this is that less space is required on a silicon chip to implement the amplifier, and it utilizes less power. The transistors M2 and M3 accomplish this by setting a voltage at their respective nodes 79 and 85 to be that of the reference voltage applied in the line 93 less a voltage drop across the gate and source of the devices M2 and M3. The voltage reference applied to the line 93 is made close to the supply voltage $V_{SS}$, thus serving the same purpose as making the transistors M4 and M5 large in their size and current carrying capacity.

Referring now to FIG. 6, an improved current bias source 35 of the preamplifier circuit of FIG. 2 will now be described. A typical basic current source 101, of a type shown in FIG. 9, is connected to the voltage supply $V_{SS}$. This current source includes a transistor M16 connected to the voltage source through a resistance R3. The voltage drop across the resistance R3 is compared by a differential amplifier 121 with a reference voltage in a line 123. The conductivity of the transistor M16 is maintained such that the voltage drop across the resistance R3 is equal to the reference voltage in line 121. The current through the series circuit including the current source 101 is then maintained constant.

The transistor M11 of FIG. 6, connected in series with the current source 101 through a node 103, and connected to the other voltage source $V_{DD}$, is a mirroring transistor in a current mirror circuit with an output transistor M12. The gate of the transistor M11, at a node 108, is connected directly to its source at a node 103, a normal connection for a current mirror circuit. However, rather than the gates of the transistors M11 and M12 being connected directly together, as is normally done in a current mirror circuit, a resistor R2 is placed therebetween. The resistor R2 is connected between the node 108 and a node 106 to which the gate of transistor M12 is connected. The resistor R2 then works with the capacitor C2, connected between the node 106 and voltage terminal $V_{DD}$, to provide a low pass filter of any undesired noise in the voltage level at node 108 from reaching the gate of the output transistor M12.

A modified version of the bias current source of FIG. 6 is shown in FIG. 7, this second embodiment having even better noise suppression characteristics. The resistance R2 of the low pass filter is connected differently. The gates of the transistors M11 and M12 are connected together through a node 105. Rather than connecting the nodes 103 and 105 directly together, as is done in the usual current mirror circuit, the resistor R2 is instead positioned therebetween. The transistor M11 and the current source 101 effectively work together to provide a highly controlled voltage at the node 105 for application to the gate of the output transistor M12. In this case, however, a resistor R2 is utilized instead, along with a capacitor C2 connected between the node 105 and the voltage terminal $V_{DD}$. The resistance and capacitance act together as a low pass filter, their values being selected to attenuate any noise at the node 103.

The gate of the transistor M12 is particularly sensitive to such noise since a variation of gate voltage is amplified into the current path of line 37. The use of the low pass filter between the transistors M11 and M12, however, suppresses that noise, at least any components of it having a frequency higher than a cutoff frequency of the filter formed by the resistance R2 and capacitance C2. As is well known, the voltage applied to the gate of the transistor M12 is selected to maintain its operation in saturation, thereby providing an output current $I_B$ that is substantially constant regardless of what load is applied to the terminal 38. The value of the current $I_B$ is set by the size of the transistor M12.

Another way of implementing a low pass filter between the mirroring and output transistors of a bias current source is shown in FIG. 8. A mirroring transistor M13 is connected between the voltage supply $V_{DD}$ and the current source 115 through a node 109. An output transistor M14 is connected between the same voltage $V_{DD}$ and a node 119. The gates of the transistors M13 and M14 are connected together through a node 107. Any noise that would normally be communicated from the node 109 to the node 107 is suppressed by a combination of an operational transconductance amplifier 111 and a capacitor C3. The output of the amplifier 111 is connected to a node 107, and has one input connected to the node 109 and another input receiving a reference voltage through a line 113. The amplifier 111 operates to maintain the voltage of the node 109 equal to the reference voltage applied to the line 113. The amplifier 111 has a very high input impedance and an output, working in conjunction with the capacitor C3, that maintains the DC voltage at the node 107 at a constant level, thus suppressing noise.

One advantage of the noise suppression approach of FIG. 8 is that the amplifier 111 can take less integrated circuit area to implement than does the resistance R2. In any of the embodiments of FIGS. 6–8, the capacitance C2 is generally large enough that it is desirably connected external to the integrated circuit chip containing the rest of the circuits being described.

An additional control of the current output, as well as an improvement of the quality of the current mirror circuit, is provided by a second operational transconductance amplifier 117 (booster) driving an output connected to a gate of a cascode transistor M15 whose source and drain are connected between the nodes 119 and 38. One of the inputs of the amplifier 117 is connected to the node 119 and the other to the reference voltage 113. Use of the amplifier 117 operates to maintain the voltage of the node 119 equal to the reference voltage applied to the line 113. The reference voltage applied to the line 113 is preferably chosen to be equal to the voltage at the output node 119, which is the voltage supply $V_{DD}$ less a voltage drop across the transistor M14 between its source and drain ($V_{DS}$). The voltages of the nodes 109 and 119 are thus caused by control loops formed by the amplifiers 111 and 117 to be maintained substantially equal, namely both substantially equal to the reference voltage in the line 113. The voltage drops ($V_{DS}$) across the transistors M13 and M14 are therefore maintained equal. The result is a current mirror circuit having a very high degree of precision.

In order to make the value of the constant output current $I_B$ programmable, the transistor M14 is shown to be programmable in response to control signals in the lines 23. This programmability is preferably obtained, as discussed above with respect to FIG. 4, by providing a number of equally sized transistors with their sources and drains connected in parallel. Individual transistors are then selectively connected into the circuit by a switching matrix that, in response to control signals in the lines 23, connects the number of gates to the node 107 which activates a selected number of transistors to collectively form the output transistor M14.

Such programmability is particularly useful for the current source 35 of FIG. 2 since the magneto-resistive head 43 exhibits varying characteristics over time, such as caused by mechanical wear, and under different operating conditions, such as with a varying temperature. The ability to program the level of the bias current $I_B$ to compensate for such changes or variations is thus quite useful. However, it should be noted that the current sources described with respect to FIGS. 5–9 are not limited to use in a systems such as shown in FIG. 2 but additionally have general applications anywhere a bias current source is needed in a circuit or system.

Although the various aspects of the present invention have been described with respect to its preferred embodiments, it will be understood that the invention is entitled to protection within the full scope of the appended claims.

It is claimed:

1. A method of increasing a gain-bandwidth product of a preamplifier that derives an output signal from a varying current signal obtained from a substantially constant current source that also supplies current to a variable resistance of a sensing element connected in series with a transistor having a conductivity control element receiving a control signal as part of a feedback loop from the preamplifier output signal, comprising the steps of driving an input of a current mode amplifier with the varying current signal, and deriving the preamplifier output signal from an output of the current mode amplifier.

2. The method according to claim 1, wherein the step of deriving the preamplifier output signal from the output of the current mode amplifier includes the step of presenting the output signal as a fully differential voltage signal.

3. The method according to claim 1, comprising an additional step of providing the current mode amplifier with a gain that is adjustable in response to an external signal.

4. The method according to claim 1, comprising an additional step of providing low pass filtering as part of the substantially constant current source, thereby to reduce effects of noise on the preamplifier.

5. A system for detecting a value of a parameter, comprising:
   a sensor characterized by having an electrical resistance that changes in a manner related to said parameter, said sensor having a first terminal connected to a reference potential and a second terminal,
   a current source providing a substantially constant current to a node,
   a field-effect transistor having one of a source or drain connected to said node and another of said source or drain connected to the second terminal of the sensor, said transistor also having a control element,
   a first amplifier having an input connected to said node and having an output, said first amplifier being a current mode amplifier, and
   a second amplifier having an input connected to the output of said current mode amplifier and having an output connected to the control element of said transistor,
   whereby an amplified signal proportional to resistance variations of the sensor occurs at said current mode amplifier output.

6. The system of claim 5 wherein the first amplifier has a higher bandwidth than said second amplifier.

7. The system of claim 5 wherein the first amplifier has an amplification between its input and its output that is programmable.

8. The system of claim 5 wherein the output of the first amplifier provides a differential output voltage signal while the input of the current mode amplifier is a single ended current.

9. The system of claim 5 wherein said current source comprises:

first and second power supply terminals of different voltages, a series circuit connected between said first and second power supply terminals in order to generate a reference potential, a second field-effect transistor having one of a source or drain connected to one of the first or second power supply terminals, another of said source or drain of the second transistor being connected to said node, said second transistor additionally including a control element, and said reference potential being connected to said second transistor control element through a low pass filter that reduces electrical noise.

10. The system of claim 9 wherein said low pass filter includes a combination of a resistance and a capacitance.

11. The system of claim 9 wherein said low pass filter includes a combination of a transconductance amplifier and a capacitance.

12. A method of amplifying a signal obtained from resistance variations of a magneto-resistive element in an environment of magnetic field variations, comprising the steps of:

applying a bias current from a constant current source through a variable conductivity transistor and said element in series, transferring a signal current from one terminal of said transistor into a current mode amplifier, and maintaining a fixed bias voltage across the magneto-resistive element by controlling the conductivity of the transistor from an output of the current mode amplifier, whereby an amplified signals that corresponds to the element resistance variations occurs at the output of the current amplifier.

13. A mass storage system, comprising:

a read head of a type having a resistance that varies proportionately to the strength of a magnetic field to which the head is exposed, a magnetic storage medium that is moved relative to said head, a source of a substantially constant electrical current, a series circuit connected between said current source and a reference, said series circuit including the head and a source and drain of a transistor, said transistor also including a control element, a current mode amplifier having an input connected to said current source and having an output, and a feedback amplifier having an input connected to said current mode amplifier output and an output connected to the transistor control element, thereby producing at said current amplifier output a signal corresponding to resistance variations of said head.

14. The system of claim 13, wherein the output of the current mode amplifier is a fully differential voltage signal.

15. The system of claim 13, wherein the current mode amplifier is provided with gain that is adjustable in response to an external signal.

16. The system of claim 13, wherein the substantially constant current source includes a low pass filtering circuit, thereby to reduce effects of noise on the preamplifier.

17. A source of substantially constant electrical current, comprising:

a series circuit connected between first and second power supply terminals of different voltages in order to generate a reference potential, a field-effect transistor having one of a source or drain connected to one of the first or second power supply terminals, another of said source or drain being connected to receive said reference potential, said transistor additionally including a control element, and said reference potential being connected to said control element through a low pass filter that reduces electrical noise that may exist in a source of power to said first and second power supply terminals or in a reference potential series circuit.

18. The system of claim 17 wherein said low pass filter includes a combination of a resistance and a capacitance.

19. The system of claim 17 wherein said low pass filter includes a combination of a transconductance amplifier and a capacitance.

* * * * *